United States Patent
Takagi et al.

(10) Patent No.: US 8,046,402 B2
(45) Date of Patent: Oct. 25, 2011

(54) SIGNAL PROCESSING METHOD AND SIGNAL PROCESSING APPARATUS

(75) Inventors: Shigetaka Takagi, Tokyo (JP); Yosuke Sakai, Tokyo (JP); Tetsuro Itakura, Tokyo (JP); Koichiro Mashiko, Takarazuka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 1163 days.

(21) Appl. No.: 11/812,371

(22) Filed: Jun. 18, 2007

(65) Prior Publication Data
US 2008/0100366 A1    May 1, 2008

(30) Foreign Application Priority Data
Jun. 19, 2006 (JP) ................ 2006-169144

(51) Int. Cl.
*G06G 7/02* (2006.01)
(52) U.S. Cl. .................................. 708/819
(58) Field of Classification Search .............. 708/819
See application file for complete search history.

(56) References Cited

U.S. PATENT DOCUMENTS

| 3,946,214 A | * | 3/1976 | Stuart et al. | 708/493 |
| 4,583,236 A | * | 4/1986 | Kromer et al. | 375/286 |
| 4,868,773 A | * | 9/1989 | Coyle et al. | 708/304 |
| 2003/0033337 A1 | * | 2/2003 | Iwasaki | 708/300 |
| 2009/0102545 A1 | | 4/2009 | Takagi et al. | |

FOREIGN PATENT DOCUMENTS

JP      2006-352441    12/2006

OTHER PUBLICATIONS

Japanese Office Action issued Oct. 12, 2010 in corresponding Japanese Patent Application 2006-169144.
Eisse Mensink et al., "Distortion Cancellation by Polyphase Multipath Circuits" IEEE Transactions on Circuits and Systems- I: Regular Papers, vol. 52, No. 9, Sep. 2005.

* cited by examiner

*Primary Examiner* — Tan V Mai
(74) *Attorney, Agent, or Firm* — Staas & Halsey LLP

(57) ABSTRACT

A signal processing method and apparatus reducing distortion using divided signals differing in only amplitude by weighting an input signal by first weights $k_i$ (i=1 to 4) to obtain divided signals, performing the same signal processing f(x) on the divided signals, weighting the signal processed divided signals by second weights $l_i$ (i=1 to 4), and adding the divided signals $V_{out1}$ to $V_{out4}$ weighted by the second weights. The first weights are $k_1=t$, $k_2=-t$, $k_3=1$, $k_4=-1$, while the second weights are $l_1=-1, l_2=1, l_3=t^3, l_4=-t^3$. Here, t=b/a (where a and b are different positive integers).

3 Claims, 6 Drawing Sheets

SIGNAL PROCESSING METHOD AND SIGNAL PROCESSING APPARATUS

CROSS REFERENCE TO RELATED APPLICATIONS

This application claims the benefit of Japanese Patent Application 2006-169144 filed Jun. 19, 2006, in the Japanese Patent Office, the disclosure of which is hereby incorporated herein by reference.

BACKGROUND OF THE INVENTION

1. Field of the Invention

The present invention relates to a signal processing method and signal processing apparatus able to reduce signal distortion.

2. Description of the Related Art

For example, an analog-digital mixed integrated circuit is promising as a system possessing both the high speed of an analog circuit and the flexibility of a digital circuit. In current analog circuits, high speed signal processing over 1 GHz or approaching 10 GHz is being sought. On the other hand, the power supply voltage has been steadily falling with each year and in the near future reportedly should become 1.0V or less. In an analog-digital mixed integrated circuit, the propagation of voltage fluctuations occurring due to the switching operations of a digital circuit through the semiconductor substrate to the analog circuit, that is, so-called "substrate noise", has been considered a problem. However, if the signal amplification is large, the substrate noise is not that much of a problem. Rather, the effect of signal distortion due to the low power voltage has become remarkable.

To reduce the distortion of the output signal, it has been proposed to provide a plurality of copied signals offset from the given input signal by exactly a phase, separately perform the same processing, return the offset phases to their original states, then add them to obtain the output (see Eisse Mensink et al., "Distortion Cancellation by Polyphase Multipath Circuits" *IEEE TRANSACTIONS ON CIRCUITS AND SYSTEMS—I: REGULAR PAPERS*, Vol. 52, No. 9, September 2005). According to this method, it has been reported that distortion of the output due to the signal processing circuit of the mixer can be reduced. However, with this configuration, a circuit for offsetting a signal by exactly the phase is required. Realization of a circuit for precisely offsetting a signal by exactly the phase over a broad signal frequency band is difficult. Further, its application is limited to a mixer.

SUMMARY OF THE INVENTION

An object of the present invention, in view of the above problems, is to provide a signal processing method and signal processing apparatus able to reduce the signal distortion without relation to the characteristics of the signal processing circuit no matter what type of signal processing circuit.

To achieve the above object, according to a first aspect of the present invention, there is provided a signal processing method having a step of weighting an input signal by first weights $k_i$ (i=1 to 4) to obtain divided signals, a step of performing the same signal processing on the divided signals, a step of weighting the signal processed divided signals by second weights $l_1$ (i=1 to 4), and a step of adding divided signals weighted by the second weights, the first weights being $k_1=t$, $k_2=-t$, $k_3=1$, $k_4=-1$, the second weights being $l=-1$, $l_2=1$, $l_3=t^3$, $l_4=-t^3$, and t=a/b wherein $\bar{a}$ and $\bar{b}$ are different positive integers.

Preferably, in the t=b/a, a=2 and b=1.

According to a second aspect of the invention, there is provided a signal processing apparatus having a first weighting means for weighting an input signal by first weights $k_i$ (i=1 to 4) to obtain divided signals, a signal processing means for performing the same signal processing on the divided signals, a second weighting means for weighting the signal processed divided signals by second weights $l_1$ (i=1 to 4), and an adding means for adding divided signals weighted by the second weights, the first weights being $k_1=t$, $k_2=-t$, $k_3=1$, $k_4=-1$, the second weights being $l_1=-1$, $l_2=1$, $l_3=t^3$, $l_4=-t^3$, and t=a/b wherein a and b are different positive integers.

Preferably, in the $\bar{t}=b/\bar{a}$, a=2 and b=1.

Preferably, at least one of the first and second weighting means is a voltage-current conversion circuit having a predetermined transconductance ratio and provided with a first field effect transistor and a second field effect transistor of the same conductivity type operating in a nonsaturated region, sources of the first and second field effect transistors being connected to a common power supply, a gate of the first transistor being applied with a predetermined bias voltage, a gate of the second transistor being applied with a sum of the predetermined bias voltage and a signal voltage, drains of the first and second field effect transistors being connected, and a sum of drain currents of the first and second field effect transistors being output.

The present invention reduces the distortion using divided signals changed in signal amplitude, so can be applied to any signal processing circuit. The weight of change of the amplitude can be selected without regard as to the characteristics of the signal processing circuit. The weighting coefficient becomes an integer ratio, so is advantageously configured as an integrated circuit. Further, there is little degradation of the circuit characteristics. Further, by configuring the weighting means by a voltage-current conversion circuit according to the present invention, it is possible to realize a circuit with little power consumption. Further, since the original circuit is used divided, there is little increase in the area occupied by the devices due to application of the present invention.

BRIEF DESCRIPTION OF THE DRAWINGS

These and other objects and features of the present invention will become clearer from the following description of the preferred embodiments given with reference to the attached drawings, wherein:

FIG. 4A is a view showing main parts of a voltage-current conversion circuit of an embodiment of the present invention, while

FIG. 7A is a view showing a total harmonic distortion component of an embodiment of the present invention, while

FIG. 8A is a view showing an example of a voltage-current conversion circuit used in an embodiment of the present invention, while

DESCRIPTION OF THE PREFERRED EMBODIMENTS

Figure 1:
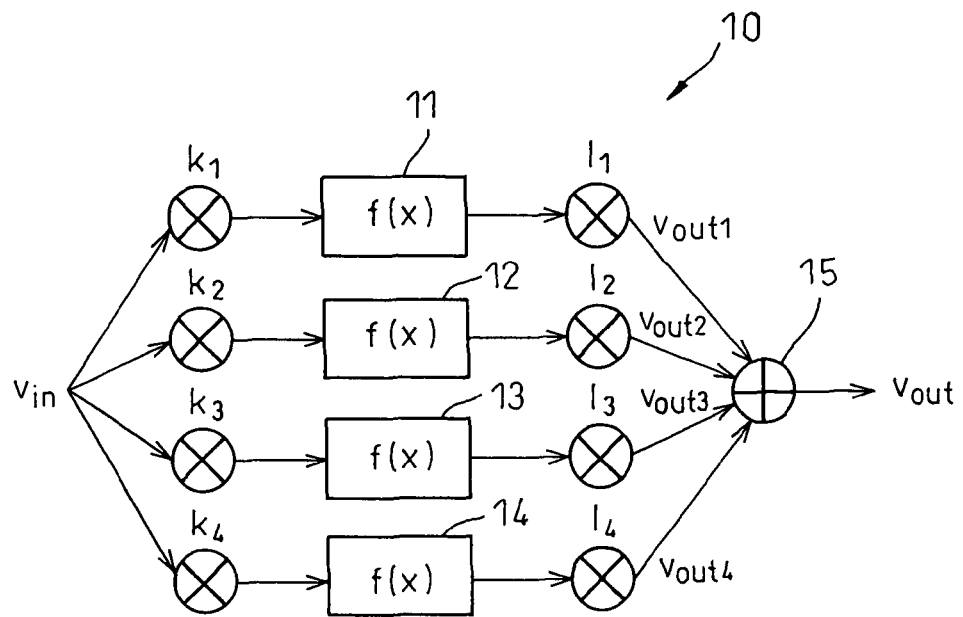
FIG. 1 is a view showing an embodiment of the present invention.

Below, an embodiment of the present invention will be explained with reference to the drawings. FIG. 1 shows a signal processing apparatus according to an embodiment of the present invention. A signal processing apparatus 10 shown in FIG. 1 creates four divided signals $k_i v_{in}$ (i=1 to 4) changed in amplitude for an input $v_{in}$, performs the same signal processing on them by signal processing circuits 11 to 14, then multiplies the results by $l_i$ (i=1 to 4) and adds the results by an adder 15.

The signal processing circuits 11 to 14 are for example made amplification circuits with gain α (constants not zero). In an amplification circuit with an gain α, in general, for an input signal $v_{in}$, the output includes not only $\alpha v_{in}$ but also second and higher distortion components. The fourth and higher terms are very small, so can be ignored. If, summarizing up to the third terms, the output $f(v_{in})$ becomes $$f(v_{in}) = a_0 + a_1 v_{in} + a_2 v^2_{in} + a_3 v^3_{in} \quad (1)$$

where, $a_0$ to $a_3$ are constants determined by the signal processing circuit

The first to fourth signal processing circuits 11 to 14 receive as input the input signals $v_{in}$ multiplied with $k_1$ to $k_4$. The signals are then processed by the first to fourth signal processing circuits $l_1$ to $l_4$. The outputs are multiplied by $l_1$ to $l_4$ to become $v_{out1}$ to $v_{out4}$. These are added by the adder 15. At this time, the outputs of the first to fourth signal processing circuits 11 to 14 are:

$$f(k_1 v_{in}) = a_0 + a_1(k_1 v_{in}) + a_2(k_1 v_{in})^2 + a_3(k_1 v_{in})^3$$

$$f(k_2 v_{in}) = a_0 + a_1(k_2 v_{in}) + a_2(k_2 v_{in})^2 + a_3(k_2 v_{in})^3$$

$$f(k_3 v_{in}) = a_0 + a_1(k_3 v_{in}) + a_2(k_3 v_{in})^2 + a_3(k_3 v_{in})^3$$

$$f(k_4 v_{in}) = a_0 + a_1(k_4 v_{in}) + a_2(k_4 v_{in})^2 + a_3(k_4 v_{in})^3 \quad (2)$$

Next, the $f(k_i v_{in})$'s are multiplied with their weights $l_i$ (i=1 to 4) to obtain the outputs $v_{outi}$, then these are added by an adder 15 so as to obtain an output voltage $v_{out}$. That is, the output $v_{out}$ becomes $$\begin{aligned} v_{out} &= v_{out1} + v_{out2} + v_{out3} + v_{out4} \quad (3) \\ &= l_1 f(k_1 v_{in}) + l_2 f(k_2 v_{in}) + l_3 f(k_3 v_{in}) + l_4 f(k_4 v_{in}) \\ &= a_0(l_1 + l_2 + l_3 + l_4) + a_1(l_1 k_1 + l_2 k_2 + l_3 k_3 + l_4 k_4) v_{in} + \\ &\quad a_2(l_1 k_1^2 + l_2 k_2^2 + l_3 k_3^2 + l_4 k_4^2) v_{in}^2 + \\ &\quad a_3(l_1 k_1^3 + l_2 k_2^3 + l_3 k_3^3 + l_4 k_4^3) v_{in}^3 \end{aligned}$$

At this time, if satisfying the conditions $$l_1 + l_2 + l_3 + l_4 = 0$$

$$l_1 k_1 + l_2 k_2 + l_3 k_3 + l_4 k_4 = \alpha$$

$$l_1 k^2_1 + l_2 k^2_2 + l_3 k^2_3 + l_4 k^2_4 = 0$$

$$l_1 k^3_1 + l_2 k^3_2 + l_3 k^3_3 + l_4 k^3_4 = 0 \quad (4)$$

regardless of the constants $a_0$ to $a_3$ determined by the characteristics of the signal processing circuit, the ideal amplifier condition $$v_{out} = \alpha a_1 v_{in} \quad (\alpha \neq 0)$$

stands. The weights $l_1$ to $l_4$ can be found if viewing equation (8) as a fourth-order linear simultaneous equation having $l_1$ to $l_4$ as unknown numbers, $$l_1 = -\frac{\alpha(k_2 k_3 + k_3 k_4 + k_4 k_2)}{(k_4 - k_1)(k_3 - k_1)(k_2 - k_1)} \quad (5)$$

$$l_2 = -\frac{\alpha(k_1 k_3 + k_3 k_4 + k_4 k_1)}{(k_4 - k_2)(k_3 - k_2)(k_1 - k_2)}$$

$$l_3 = -\frac{\alpha(k_2 k_1 + k_1 k_4 + k_4 k_2)}{(k_4 - k_3)(k_1 - k_3)(k_2 - k_3)}$$

$$l_4 = -\frac{\alpha(k_2 k_3 + k_3 k_1 + k_1 k_2)}{(k_1 - k_4)(k_3 - k_4)(k_2 - k_4)}$$

In other words, if suitably setting the input side weights $k_1$ to $k_4$ and setting the output side weights $l_1$ to $l_4$ by equation (5), not only the zeroth and second terms of $v_{in}$, but also the third term can be removed. That is, the distortion of the second term and third term which had been a problem in current communication systems can be removed.

The basic configuration of the signal processing apparatus of the present invention explained above has been applied for by one of the inventors as a signal processing circuit able to reduce harmonic distortion (PCT/JP2006/309123).

The present invention, as explained in detail below, gives specific values to the weights $k_1$ to $k_4$ advantageous in circuit production and provides a circuit embodying those weights.

As explained above, in the signal processing apparatus of FIG. 1, the four divided input signals $v_{in}$ are multiplied with $k_1$ to $k_4$ and input to the same signal processing circuits 11 to 14. In the present invention, the weights or coefficients $k_1$ to $k_4$ are made $k_1 = t$, $k_2 = -t$, $k_3 = 1$, $k_4 = -1$ and $t = b/a$ (a and b are different positive integers). At this time, the coefficients $l_1$ to $l_4$ are calculated by equation 5, where $l_1 = -1$, $l_2 = 1$, $l_3 = t^3$, and $l_4 = -t^3$.

Further, in the present embodiment, $k_1 = \frac{1}{2}$, $k_2 = -\frac{1}{2}$, $k_3 = 1$, and $k_4 = -1$. In this case, $l_1 = -1$, $l_2 = 1$, $l_3 = \frac{1}{8}$, and $l_4 = -\frac{1}{8}$.

Figure 2:
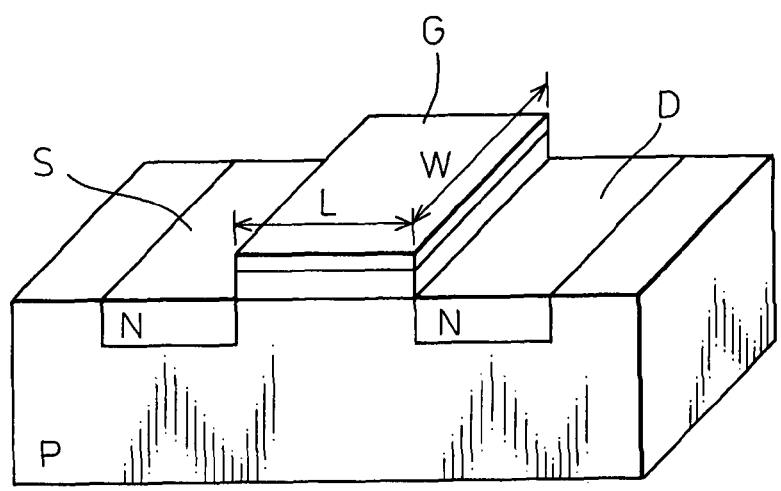
FIG. 2 is a view showing the schematic structure of a MOSFET.

FIG. 2 is a schematic view of an n-channel MOSFET (metal-oxide semiconductor field-effect transistor). A p-substrate is doped with a high concentration of n-type impurities to form a source S and drain D, a thin silicon oxide film is formed on the p-substrate, then a gate G formed by polysilicon is formed on top of that. Here, if the gate has a channel width W and channel length L, the coefficients $k_i$ can be determined by W/L. Therefore, if configuring the coefficients $k_1$ to $k_4$ by predetermined integer ratios and making the coefficients $l_1$ to $l_4$ integer ratios as well, this would be extremely advantageous for production of an integrated circuit. Further, since the weighting coefficients are integer ratios, there is little degradation of the circuit characteristics. In an integrated circuit, the precision of the ratio is about 0.1%, so for example a combination of coefficients requiring several orders of precision can become a factor causing degradation of the circuit characteristics.

Figure 3:
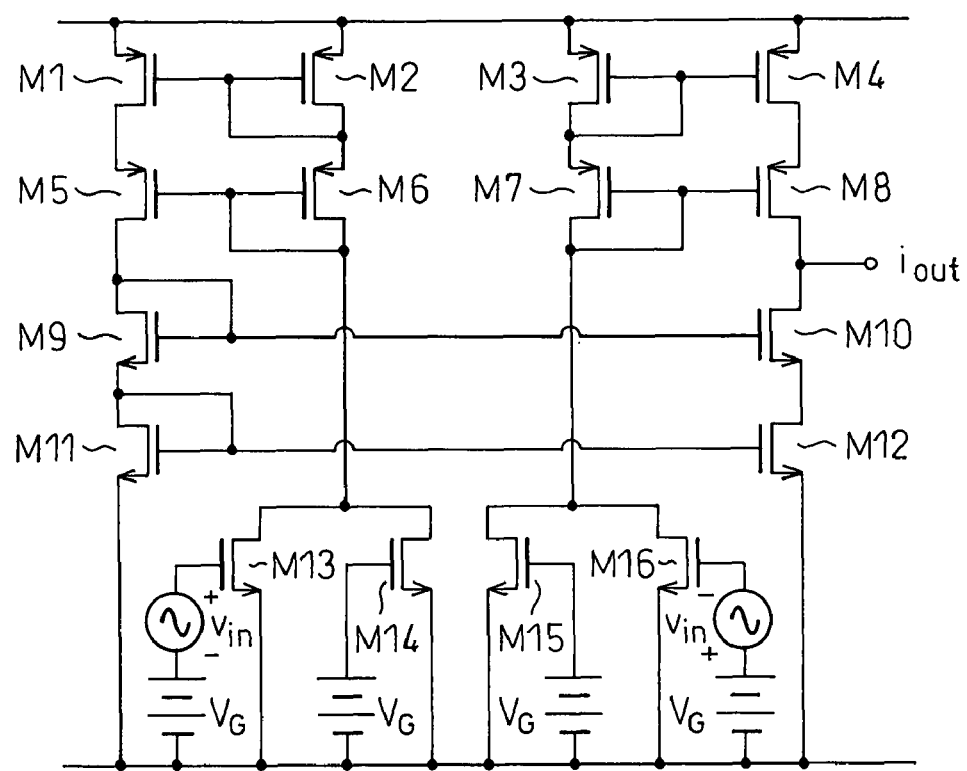
FIG. 3 is a view showing a voltage-current conversion circuit multiplying a signal used in the embodiment of the present invention by k.

FIG. 3 shows a circuit multiplying the input signal by k forming an embodiment of the present invention by a voltage-controlled current source circuit or voltage-current conversion circuit. The voltage-controlled current source circuit of FIG. 3 is configured as a device able to be realized completely by transistors, resistors, or other integrated circuits as components.

The transistors M1 to M8 are p-channel MOSFETs, while the transistors M9 to M12 are comprised of n-channel MOSFETs. The transistors M1 to M6, M3 to M8, and M9 to M12 are configured as current mirror circuits. The output $i_{out}$ is taken out from the node of the drain of the transistor M8 and the drain of the transistor M10.

In the circuit of FIG. 3, the transistor M13 having the input signal $v_{in}$ as its input is connected with the transistor M14 at their drains. The drain currents of the transistors M13 and M14 are added. The gate of the transistor M13 has the serial circuit of the bias $V_G$ and the signal $v_{in}$ connected to it, while the source of the transistor M13 is grounded. Further, the gate of the transistor M14 has only the bias $V_G$ connected to it, while the source of the transistor M14 is grounded.

The inverted input signal $-v_{in}$ of the input signal $v_{in}$ is input to the transistor M16. The transistor M16 is connected to the transistor M15 at their drains, and the drain currents of the transistors M15 and M16 are added. The gate of the transistor M16 is connected to the serial circuit of the bias $V_G$ and signal $v_{in}$, while the source of the transistor M15 is grounded. Further, the gate of the transistor M15 has only the bias $V_G$ connected to it, while the source of the transistor M14 is grounded. In short, the circuit of the transistor M16 and the transistor M15 is configured in the same way as the transistors M13 and M14 and forms a differential configuration.

In FIG. 3, the transistors M13 and M14 operate in the nonsaturated region. In general, the drain current $I_D$ of the transistor operating in the nonsaturated region is given as follows:

$$I_0 = 2K\left(V_{GS} - V_T - \frac{V_{DS}}{2}\right)V_{DS} \quad (6)$$

where, K: transconductance coefficient
$V_{GS}$: gate-source voltage
$V_T$: threshold voltage
$V_{DS}$: drain-source voltage If the ratio of the transconductance coefficients of the transistors M13 and M14 at this time is 1-k:k, the sum of the drain current ID13 of the transistor M13 and the drain current ID14 of the transistor M14 becomes $$I_{D13} + I_{D14} = 2(1-k)K\left(V_{GS} - V_T - \frac{V_{DS}}{2}\right)V_{DS} + \quad (7)$$
$$2kK\left(V_{GS} + v_{in} - V_T - \frac{V_{DS}}{2}\right)V_{DS}$$
$$= 2K\left(V_{GS} + kv_{in} - V_T - \frac{V_{DS}}{2}\right)V_{DS}$$

Equivalently, this becomes the input signal $v_{in}$ multiplied by k.

Figure 4A:
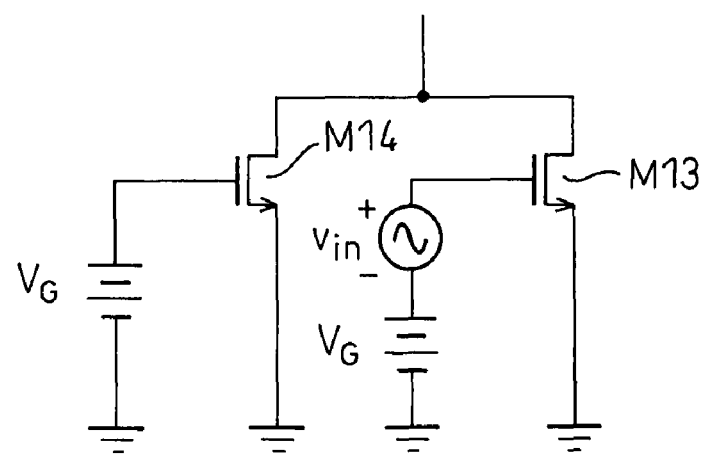
Figure 4B:
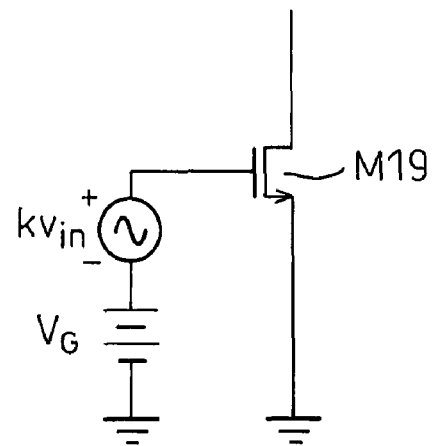
FIG. 4B is a view showing an equivalent circuit of FIG. 4A.

That is, the circuit of the transistor M13 and transistor M14 shown in FIG. 4A receiving as input the signal $v_{in}$ is equivalent to the circuit of the transistor M19 shown in FIG. 4B receiving as input the signal $kv_{in}$. Note that the same is true for the circuit of the transistors M16 and M15. The k-multiplication circuit of the transistors M13 and M14 of the present embodiment has a low power consumption and can be made a k-multiplication circuit using the circuit shown in FIG. 4A by itself.

Figure 5A:
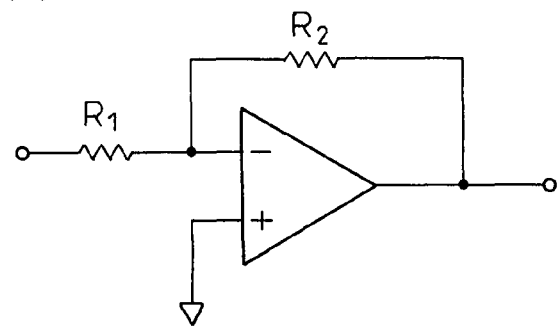
FIG. 5A is a view showing an inverting amplifier multiplying a signal used by an embodiment of the present invention by k.
Figure 5B:
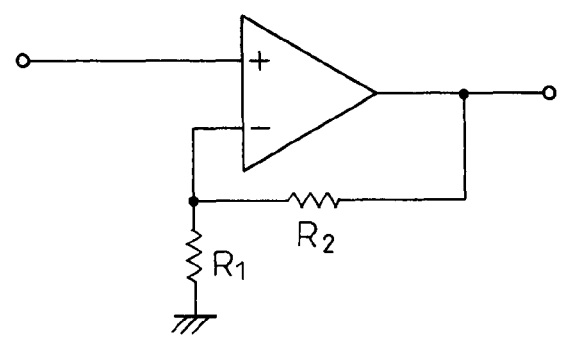
FIG. 5B is a view showing a noninverting amplifier multiplying a signal used in an embodiment of the present invention by k.

As explained above, in the present embodiment, the circuit shown in FIG. 3 is used as the circuit for multiplying the input by $k_i$, but it is also possible to use a known amplification circuit. FIGS. 5A and 5B show examples. FIG. 5A shows an inverting amplification circuit with an output of the input x−R2/R1. Further, FIG. 5B shows a noninverting amplification circuit with an output of the input x (R1+R2)/R1. In this way, by selecting the resistances R1 and R2, $k_i$ can be determined.

Next, the technique of determining the sign of the coefficient $k_i$ will be explained. If inverting the polarity of the input entering the transistor M13 of FIG. 3 and inverting the input of the transistor M16, a coefficient $k_i$ of an opposite polarity from the circuit of FIG. 3 is obtained. The circuit shown in FIG. 3 has a differential configuration and has two inputs, but it is also possible not to use a differential configuration and use a circuit of the transistors M13 and M14 alone. In this case, by inverting the polarity of the input signal, an opposite polarity coefficient is obtained.

The thus k-multiplied input signal is input to any signal processing circuit f(x) and signal processed, then multiplied by $l_i$, added, and output. Here, for the $l_i$-multiplied circuit, the circuit shown in FIG. 3 may be used. A $l_i$-multiplication circuit can be realized by replacing the k of the above-mentioned k-multiplication circuit with 1. By adopting the configuration of the circuit of FIG. 1 in this way, it is possible to reduce the second and third harmonic distortions compared with the use of the signal processing circuit f(x).

Next, the action and effect of the embodiment to which the present invention is applied will be confirmed. For this reason, the circuit of FIG. 3 is used to construct an example of the signal processing apparatus of FIG. 1. As explained above, the circuit of FIG. 3 was explained as a circuit for multiplication by $k_i$. Here, the circuit of FIG. 3 corresponds to a series of circuits multiplying the input by $k_i$, performing the signal processing f(x), and further multiplying the result by $l_i$. In other words, four of the circuits of FIG. 3 configured to multiply the input by $k_i$, perform the signal processing f(x), and further multiply the result by $l_i$ are provided and their outputs are added to form an example of the signal processing apparatus of FIG. 1.

In the voltage-controlled current source circuit of FIG. 3, to realize multiplication of the output by $l_i$, the transconductance coefficients of the transistors M4, M8, M10, M12 forming part of the current mirror circuit are multiplied by $l_i$. For example, if looking at the transistor M4, by multiplying the ratio W/L of the gate width and gate length of the transistor M4 by $l_i$ compared with the W/L of the transistor M3, a $l_i$ multiple of the transconductance coefficient is realized. By performing the same for the other transistors M8, M10, M12, the transconductance coefficient is multiplied by $l_i$. In the present embodiment, for $k_1=\frac{1}{2}$, $l_1=-1$, for $k_2=-\frac{1}{2}$, $l_2=1$, for $k_3=1$, $l_3=\frac{1}{8}$, and for $k_4=-1$, $l_4=-\frac{1}{8}$.

Figure 6:
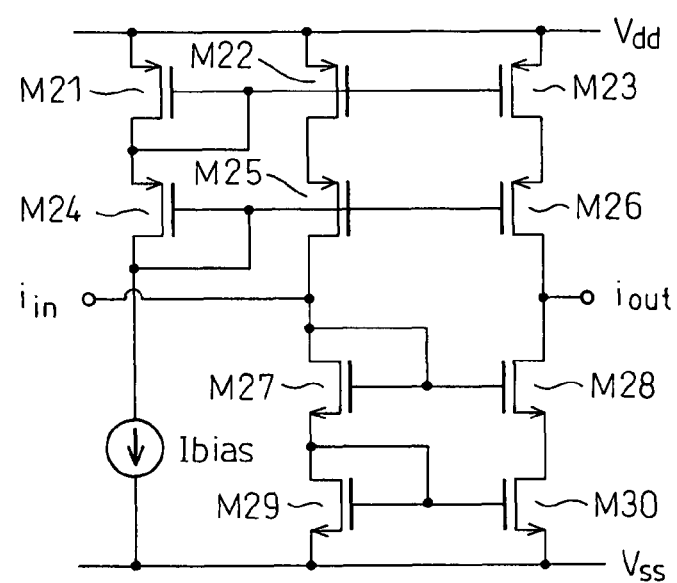
FIG. 6 is a view showing a sign inverting circuit used in an embodiment of the present invention.

Regarding the sign, the current mirror circuit for current inversion shown in FIG. 6 is used. FIG. 6 is comprised of a current mirror circuit comprised of the p-channel MOSFET transistors M21, M22, M23, M24, M25, and M26 and a current mirror circuit comprised of the n-channel MOSFET transistors M27, M28, M29, and M30 and outputs an output signal lout inverted in polarity from the sign of the input signal $l_{in}$. By connecting this current inverting circuit to the output of the circuit multiplying the transconductance coefficients of the transistors M4, M8, M10, M12 of the voltage-controlled current source circuit of FIG. 3 by $l_i$, the sign can be inverted and a predetermined sign can be given to the $l_i$.

Figure 7A:
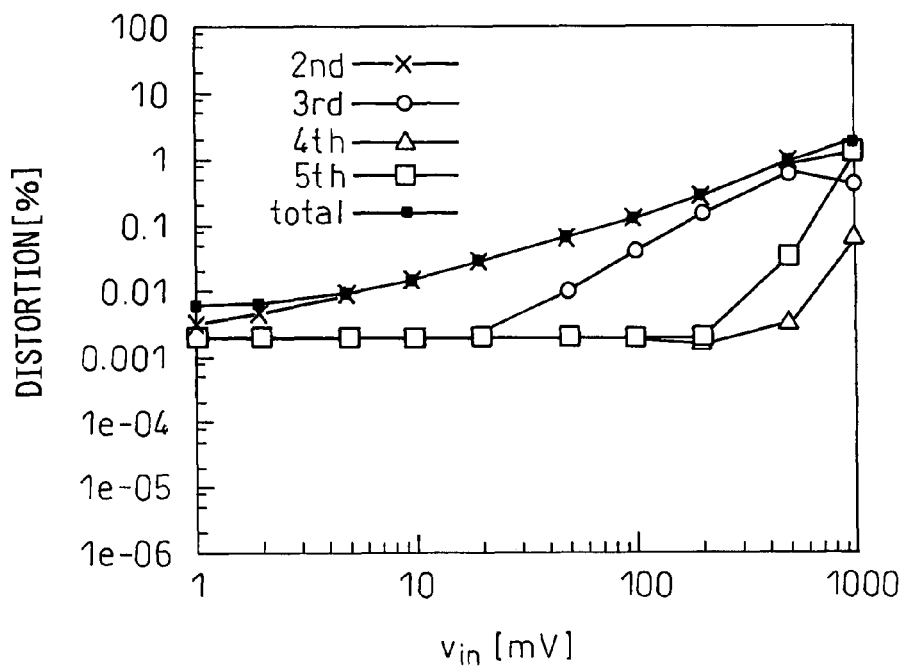
Figure 7B:
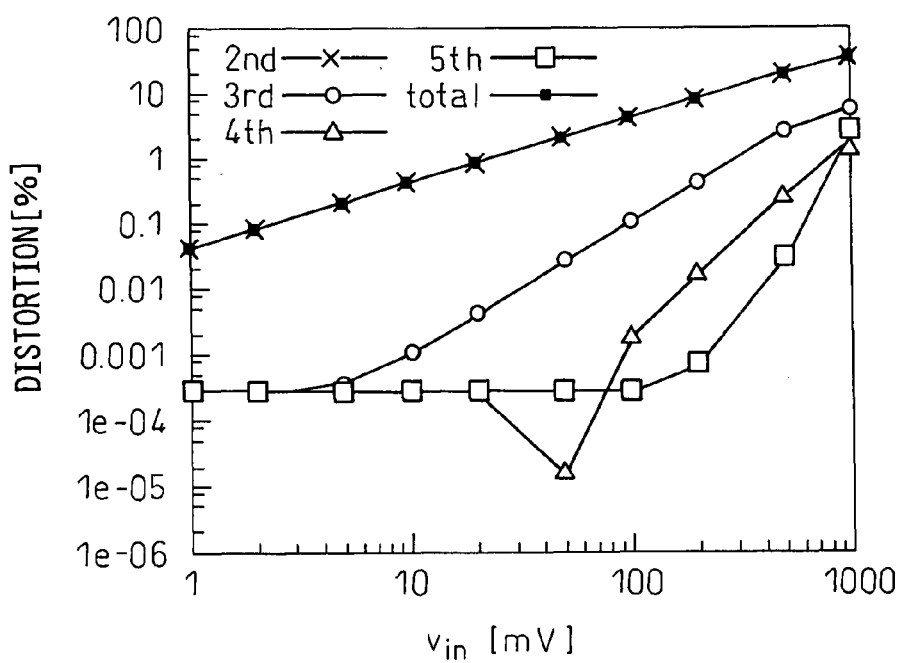
FIG. 7B is a view showing a total harmonic distortion component of a conventional circuit.

FIG. 7A is a graph showing the total harmonic distortion of the embodiment of the present invention forming the circuit of FIG. 1 based on the circuit of FIG. 3. That is, the harmonic distortion of FIG. 7A is the harmonic distortion when configuring the circuit multiplying an input by $k_i$ and performing the signal processing circuit f(x) and further multiplying the result by $l_i$ by the voltage-controlled current source circuit of FIG. 3 and measuring distortion for a circuit configured as shown in FIG. 1 using $k_1=\frac{1}{2}$, $k_2=-\frac{1}{2}$, $k_3=1$, $k_4=-1$. FIG. 7B is a graph showing the total harmonic distortion of a conventional voltage-controlled current source circuit alone.

As will be understood from a comparison of FIGS. 7A and 7B, in the circuit of the present embodiment, the second and third harmonic distortions are sufficiently reduced compared with a conventional circuit. Overall as well, the distortion is suppressed to within 0.1% even with an input voltage of 100 mV.

Figure 8A:
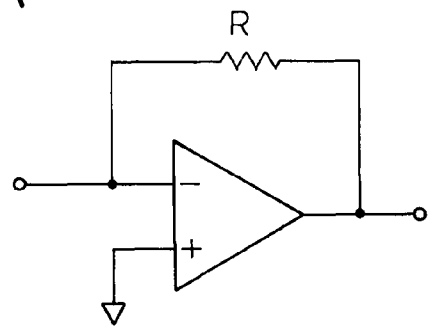
Figure 8B:
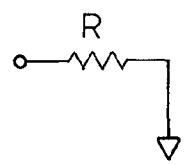
FIG. 8B is a view showing another example.

Note that the circuit of FIG. 3 outputs a current, but for conversion to a voltage output, a circuit such as shown in FIG. 8A connecting the inverted input terminal and output terminal of an operational amplifier by the resistance R may be used. Further, as shown in FIG. 8B, it is also possible to obtain the voltage output by just connecting the output resistances R.

Figure 9:
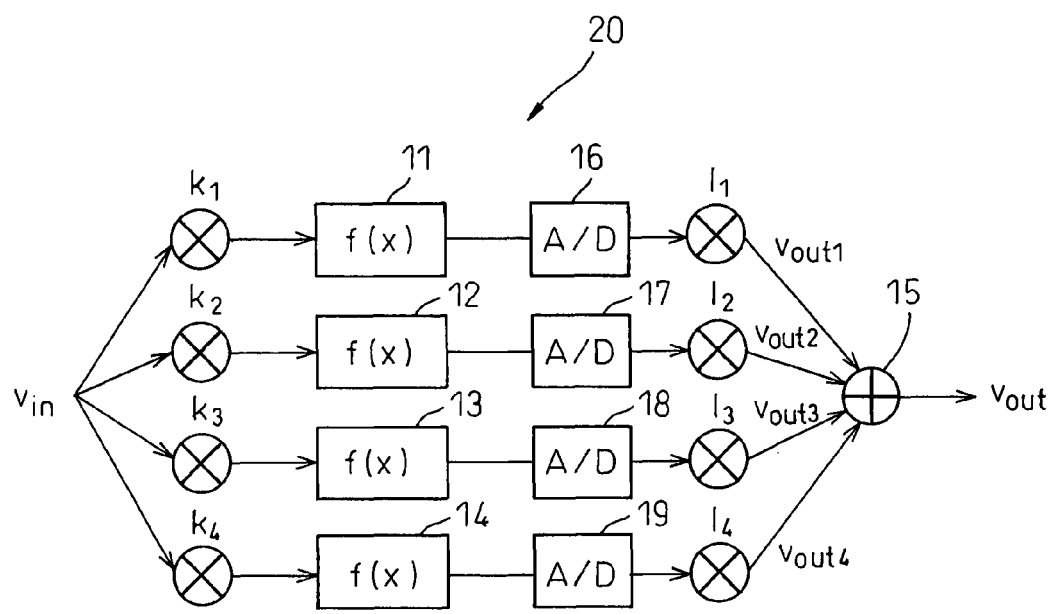
FIG. 9 is a view showing another embodiment of the present invention.

FIG. 9 is a view showing another embodiment of the present invention. This embodiment, compared with the embodiment shown in FIG. 1, performs the same signal processing by the signal processing circuits 11 to 14, then converts the results to digital signals by the A/D converters 16 to 19, performs digital signal processing, multiplies the results by the coefficients $l_i$, and adds the results by the adder 15. At the present time, in the highly integrated circuits, the breakdown voltages are falling, so the power supply voltage is unavoidably dropping. Therefore, if adding the results, then trying to convert them from an analog to digital signal, the added signal becomes large in amplitude, so distortion ends up occurring due to the addition. As in the present embodiment, by A/D conversion before multiplication by a coefficient, it is possible to prevent the occurrence of distortion of a large amplitude signal to obtain a digital signal and possible to digitally signal process the signal after that. With a digital signal, the processing will not result in the appearance of a large amplitude signal.

While the invention has been described with reference to specific embodiments chosen for purpose of illustration, it should be apparent that numerous modifications could be made thereto by those skilled in the art without departing from the basic concept and scope of the invention.

The invention claimed is:

1. A signal processing apparatus having:
   first weighting circuits configured to weight an input signal by first weights $k_i$ (i=1 to 4) to obtain divided signals,
   signal processing circuits configured to perform the same signal processing on the divided signals,
   second weighting circuits configured to weight the signal processed divided signals by second weights $I_i$ (i=1 to 4), and
   an adding circuit configured to add divided signals weighted by the second weights,
   the first weights being $k_1=t$, $k_2=-t$, $k_3=1$, $k_4=-1$,
   the second weights being $I_1=-1$, $I_2=1$, $I_3=t^3$, $I_4=-t^3$, and
   t=a/b wherein a and b are different positive integers.

2. The signal processing apparatus as set forth in claim 1, wherein in said t=b/a, a=2 and b=1.

3. The signal processing apparatus as set forth in claim 1, wherein
   at least one of said first and second weighting circuits is a voltage-current conversion circuit having a predetermined transconductance ratio and provided with a first field effect transistor and a second field effect transistor of the same conductivity type operating in a nonsaturated region,
   sources of said first and second field effect transistors being connected to a common power source,
   a gate of said first transistor being supplied with a predetermined bias voltage,
   a gate of said second transistor being supplied with a sum of said predetermined bias voltage and a signal voltage,
   drains of said first and second field effect transistors being connected, and
   a sum of drain currents of said first and second field effect transistors being output.

* * * * *

UNITED STATES PATENT AND TRADEMARK OFFICE
CERTIFICATE OF CORRECTION

PATENT NO. : 8,046,402 B2  Page 1 of 1
APPLICATION NO. : 11/812371
DATED : October 25, 2011
INVENTOR(S) : Shigetaka Takagi et al.

It is certified that error appears in the above-identified patent and that said Letters Patent is hereby corrected as shown below:

Title Page, Column 2 (Abstract), Line 9, Delete "$l_1=-_{1, l2=1, l3}=t^3, l_4=-t^3$." and insert -- $l_1=-1, l_2=1, l_3=t^3, l_4=-t^3$. --, therefor.

Signed and Sealed this
Seventh Day of February, 2012

David J. Kappos
*Director of the United States Patent and Trademark Office*